(12) United States Patent
Shi et al.

(10) Patent No.: US 11,062,109 B2
(45) Date of Patent: Jul. 13, 2021

(54) DISPLAY APPARATUS WITH FINGERPRINT IDENTIFICATION AND FABRICATION METHOD THEREOF

(71) Applicant: Xiamen Tianma Micro-Electronics Co., Ltd., Xiamen (CN)

(72) Inventors: Xiaoqi Shi, Xiamen (CN); Zhipeng Huang, Xiamen (CN); Bozhi Liu, Xiamen (CN); Shoujin Cai, Xiamen (CN); Guozhao Chen, Xiamen (CN)

(73) Assignee: XIAMEN TIANMA MICRO-ELECTRONICS CO., LTD., Xiamen (CN)

( * ) Notice: Subject to any disclaimer, the term of this patent is extended or adjusted under 35 U.S.C. 154(b) by 0 days.

(21) Appl. No.: 16/556,688

(22) Filed: Aug. 30, 2019

(65) Prior Publication Data
US 2020/0193126 A1 Jun. 18, 2020

(30) Foreign Application Priority Data
Dec. 14, 2018 (CN) .......................... 201811532633.1

(51) Int. Cl.
*G02F 1/1333* (2006.01)
*G06K 9/00* (2006.01)
*G02F 1/1335* (2006.01)
*G02F 1/1362* (2006.01)
*G02F 1/1368* (2006.01)
(Continued)

(52) U.S. Cl.
CPC ....... *G06K 9/00013* (2013.01); *G02F 1/1368* (2013.01); *G02F 1/13338* (2013.01); *G02F 1/133512* (2013.01); *G02F 1/133514* (2013.01); *G02F 1/136209* (2013.01); *G02F 1/136286* (2013.01); *H01L 27/124* (2013.01); *H01L 27/1259* (2013.01); *H01L 27/14678* (2013.01)

(58) Field of Classification Search
CPC .......... G02F 1/13338; G02F 1/133512; G02F 1/133514; G02F 1/136209; G02F 1/136286; G02F 1/1368; H01L 27/124; H01L 27/1259; H01L 27/14678; G06K 9/00013
See application file for complete search history.

(56) References Cited

U.S. PATENT DOCUMENTS

2017/0251137 A1\* 8/2017 Evans, V ............. H04N 5/2354
2020/0293739 A1\* 9/2020 Yang ................... H01L 27/3276

FOREIGN PATENT DOCUMENTS

CN 1689025 A 10/2005
CN 202870432 U 4/2013
(Continued)

*Primary Examiner* — Lisa S Landis
(74) *Attorney, Agent, or Firm* — Anova Law Group PLLC

(57) ABSTRACT

A display apparatus and a method for fabricating a display apparatus are provided. The display apparatus includes a backlight module and a display panel opposite to the backlight module. The display panel includes an array substrate and a color film substrate opposite to the array substrate. The array substrate is disposed on a side of the color film substrate away from the backlight module. The color film substrate includes a black matrix. The array substrate includes a plurality of fingerprint identification components; and an orthographic projection of the plurality of fingerprint identification components on the backlight module is within an orthographic projection of the black matrix on the backlight module.

14 Claims, 9 Drawing Sheets

(51) Int. Cl.
*H01L 27/12* (2006.01)
*H01L 27/146* (2006.01)

(56) References Cited

FOREIGN PATENT DOCUMENTS

| | | |
|---|---|---|
| CN | 106611170 A | 5/2017 |
| CN | 106773219 A | 5/2017 |
| CN | 107341472 A | 11/2017 |
| CN | 108182872 A | 6/2018 |

\* cited by examiner

DISPLAY APPARATUS WITH FINGERPRINT IDENTIFICATION AND FABRICATION METHOD THEREOF

CROSS-REFERENCES TO RELATED APPLICATIONS

This application claims priority of Chinese Patent Application No. 201811532633.1, filed on Dec. 14, 2018, the entire contents of which are hereby incorporated by reference.

FIELD OF THE DISCLOSURE

The present disclosure generally relates to the field of display technology and, more particularly, relates to a display apparatus and a method for fabricating a display apparatus.

BACKGROUND

In a display apparatus, a photoelectric sensor, such as a photodiode, is often used to identify a fingerprint. Usually, the photodiode is disposed on an array substrate. During the process of being emitted from the display panel and then being reflected back to the photodiode by a finger, light needs to pass through a relatively large number of layer structures. Thus, the light may be attenuated; and the accuracy of the fingerprint identification may be not as desired.

The disclosed display apparatus and method for fabricating a display apparatus are directed to solve one or more problems set forth above and other problems in the art.

BRIEF SUMMARY OF THE DISCLOSURE

One aspect of the present disclosure provides a display apparatus. The display apparatus includes a backlight module and a display panel opposite to the backlight module. The display panel includes an array substrate and a color film substrate opposite to the array substrate. The array substrate is disposed on a side of the color film substrate far away from the backlight module. The color film substrate includes a black matrix. The array substrate includes a plurality of fingerprint identification components; and an orthographic projection of the plurality of fingerprint identification components on the backlight module is within an orthographic projection of the black matrix on the backlight module Another aspect of the present disclosure provides a method for fabricating a display apparatus. The method includes providing a color film substrate having a black matrix; providing an array substrate and forming a plurality of fingerprint identification components on the array substrate; packaging the color film substrate and the array substrate to form a display panel; providing a backlight module; and assembling the display panel and the backlight module. During the process for assembling the display panel and the backlight module, the color film substrate is assembled to face a light-emitting surface of the backlight module and to allow an orthographic projection of the plurality of fingerprint identification components on the backlight module to be within an orthographic projection of the black matrix on the backlight module.

Other aspects of the present disclosure can be understood by those skilled in the art in light of the description, the claims, and the drawings of the present disclosure.

BRIEF DESCRIPTION OF THE DRAWINGS

The following drawings are incorporated in and constitute a part of the specification, illustrating embodiments of the present disclosure, and together with the detailed descriptions serve to explain the mechanism of the present disclosure.

DETAILED DESCRIPTION

Figure 1:
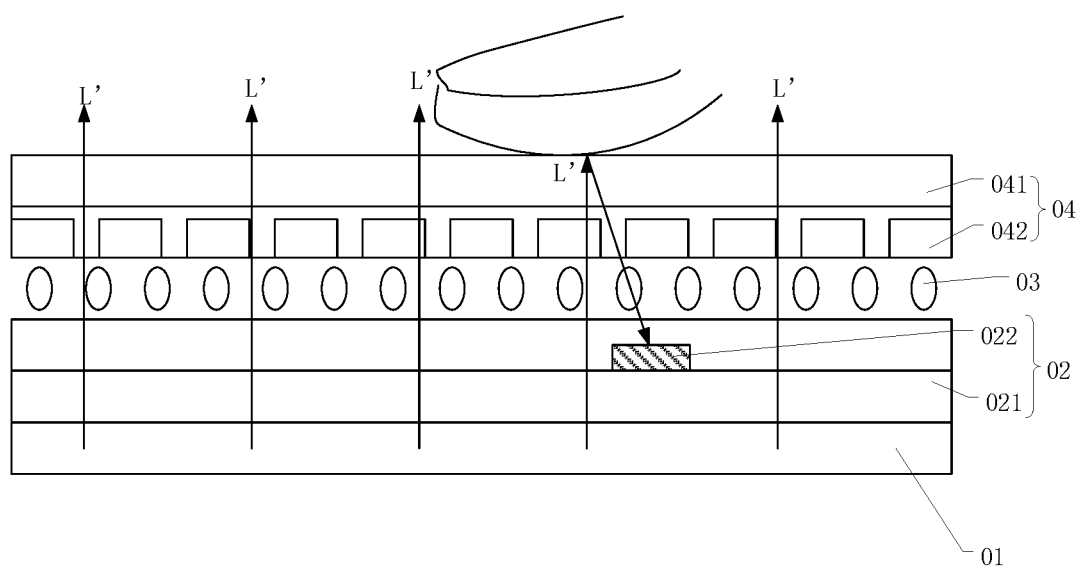
FIG. 1 illustrates a display apparatus.

Reference will now be made in detail to exemplary embodiments of the disclosure, which are illustrated in the accompanying drawings. Hereinafter, embodiments consistent with the disclosure will be described with reference to drawings. Wherever possible, the same reference numbers will be used throughout the drawings to refer to the same or like parts. It is apparent that the described embodiments are some but not all the embodiments of the present disclosure. Based on the disclosed embodiments, persons of ordinary skill in the art may derive other embodiments consistent with the present disclosure, all of which are within the scope of the present disclosure. Further, in the present disclosure, the disclosed embodiments and the features of the disclosed embodiments may be combined when there are no conflicts.

Certain techniques, methods, and apparatus that are understandable to the persons of ordinary skill in the art may not be described in detail. However, under appropriate conditions, such techniques, methods and apparatus are also included as the parts of the description.

In the disclosed embodiments, specific values may be explained for illustrative purposes and might not be used as limitations. Thus, embodiments may have different specific values.

Further, the similar symbols and letters in the drawings may denote similar elements. Thus, once one element is defined in one drawing, it may not need to be defined in the following drawings.

FIG. 1 illustrates a display apparatus. As shown in FIG. 1, the display apparatus includes a backlight module 01, an array substrate 02, a liquid crystal layer 03, and a color film substrate 04. The array substrate 02 includes an array substrate 021 and a photo-sensor 022. The color film substrate 04 includes a color filter substrate 041 and a color filter layer 042. The light L' emitted from the backlight module 01 is reflected by a finger and reaches the photo-sensor 022. In such a process, the light L' needs to pass through the liquid crystal layer 03 twice and pass through the color filter layer 042 twice. After passing through so many layers, the transmittance of the light L' is reduced; and the light L' has a significantly large loss. Further, the liquid crystal layer 03 and the color filter layer 042 interfere with the reflected light. Thus, the accuracy of the photo-sensor 022 is adversely affected.

The present disclosure provides a display apparatus and a method of fabricating a display apparatus. Embodiments of the display apparatus and the method for fabricating a display apparatus provided by the present disclosure will be described in detail below.

Figure 2:
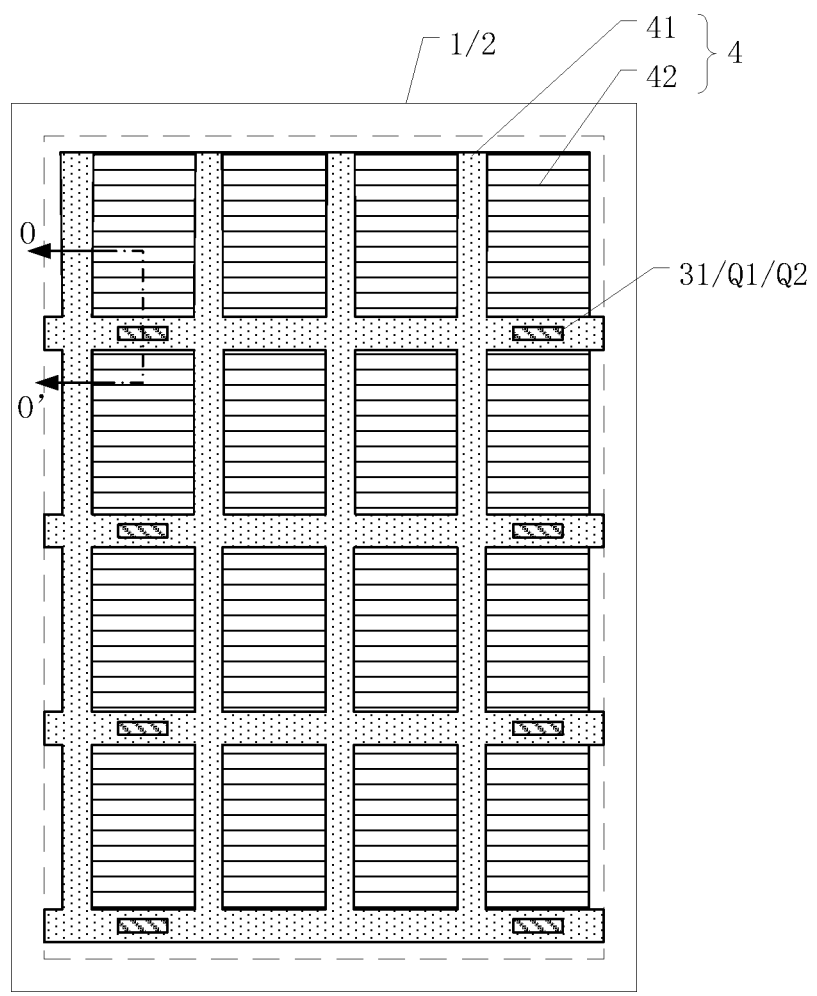
FIG. 2 illustrates an exemplary display apparatus consistent with various disclosed embodiments.
Figure 3:
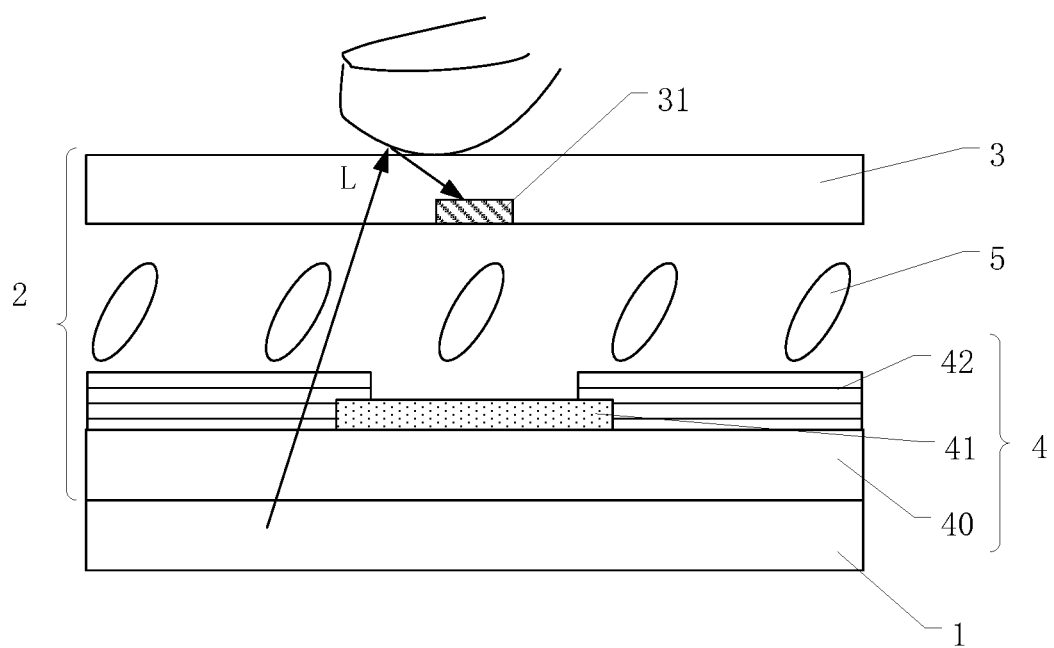
FIG. 3 illustrates an OO'-sectional view of the display apparatus in FIG. 2 consistent with various disclosed embodiments.

FIGS. 2-3 illustrate an exemplary display apparatus consistent with various disclosed embodiments. FIG. 3 is an OO'-sectional view of the display apparatus in FIG. 2.

As shown in FIGS. 2-3, the display apparatus may include a backlight module 1 and a display panel 2 opposite to the backlight module 1. The display panel 2 may include an array substrate 3 and a color film substrate 4 opposite to the array substrate 3. The array substrate 3 may be disposed on a side of the color film substrate 4 away from the backlight module 1. The color filter substrate 4 may include a black matrix 41. The array substrate 3 may include a plurality of fingerprint identification components 31. The orthographic projection of the fingerprint identification components 31 on the backlight module 1 may be within the orthographic projection of the black matrix 41 on the backlight module 1.

In one embodiment, the display panel 2 may further include a liquid crystal layer 5; and the color film substrate 4 may further include a second substrate 40 and a plurality of color filters 42. It should be noted that the present embodiment is only exemplified by the display panel 2 being a liquid crystal display panel. The display apparatus provided by the present disclosure may also be other types of display panel. The type of the display panel is not limited by the present disclosure.

In the present disclosure, the term "inverted" refers that the positions of the array substrate and the color film substrate in the display panel may be switched, and the light-emitting surface of the backlight module and the color film substrate may be set adjacently. The light emitted by the backlight module may first reach the color film substrate and then reach the array substrate.

In particular, as shown in FIG. 2-3, the plurality of fingerprint identification components 31 may be disposed on the array substrate 3. The black matrix 41 may be disposed on the color film substrate 4. The color film substrate 4 may be disposed between the backlight module 1 and the array substrate 3. That is, the layer positions of the color film substrate 4 and the array substrate 3 may be inverted. After the light L emitted from the backlight module 1 is emitted from the display panel 2, the light may be reflected by a finger to form reflected light. The reflected light may be transmitted to the fingerprint identification components 31 on the display panel 2. The fingerprint identification components 31 may perform a data acquisition of the optical signals incident thereon. In the date acquisition process, due to the presence of the specific texture of the fingerprint, the intensity of the reflected light may be different at each position of the ridges and the valleys of the finger, and the optical signals collected by the fingerprint identification elements 31 may be different. Thus, the fingerprint identification may be performed. In the display apparatus provided in the present disclosure, the fingerprint identification components 31 may be still disposed on the array substrate 3. However, because the array substrate 3 and the color film substrate 4 may be inverted, during the process for the light L emitted from the backlight module 1 being emitted from the display panel 2, the light may need to pass through the color filters 42 and the liquid crystal layer 23. However, during the process for the light L to be reflected back to the fingerprint identification components 31, the light L may not need to pass through the liquid crystal layer 23 and the color filters 42 again. In particular, the light L may pass through a less number of layer structures, and may only need to pass through the liquid crystal layer 23 and the color filters 42 once. Thus, the interference of the liquid crystal layer 23 and the color filters 42 with the light L may be reduced.

In the disclosed display apparatus, the fingerprint identification components may be disposed on the array substrate, and the color film substrate and the array substrate may be inverted. Thus, the light emitted by the backlight module may not need to pass through the layer structures, such as the liquid crystal layer and the color filters, again when being reflected back to the fingerprint identification components. Accordingly, the number of the layer structures the light passing through may be reduced; and the loss of the light may be reduced. Secondly, in the disclosed display apparatus, the light may only need to pass through the liquid crystal layer and the color filters during the light-emitting process, but may not need to pass through the liquid crystal layer and the color filters during the reflection process. Thus, the interference of the liquid crystal layer and the color filters to the light may be reduced, and the precision of the fingerprint identification may be improved.

In one embodiment, referring to FIGS. 2-3, the color film substrate 4 may include a plurality of color filters 42, and at least a portion (e.g., a certain number) of the color filters 42 may be white in color.

In the disclosed display apparatus, at least a portion of the color filters 42 may be white in color. When the light emitted by the backlight module 1 passes through the color filters 42, because the portion of the color filters 42 may be white in color, the loss of the light L may be small, and the transmittance of the light may be substantially strong. Thus, the intensity of the light reflected from the finger back to the fingerprint identification components 31 may also be substantially strong. The stronger the intensity of the optical signal received by the fingerprint identification components 31 is, the better the accuracy of the fingerprint identification is. Accordingly, the accuracy of the fingerprint identification may be enhanced.

Figure 4:
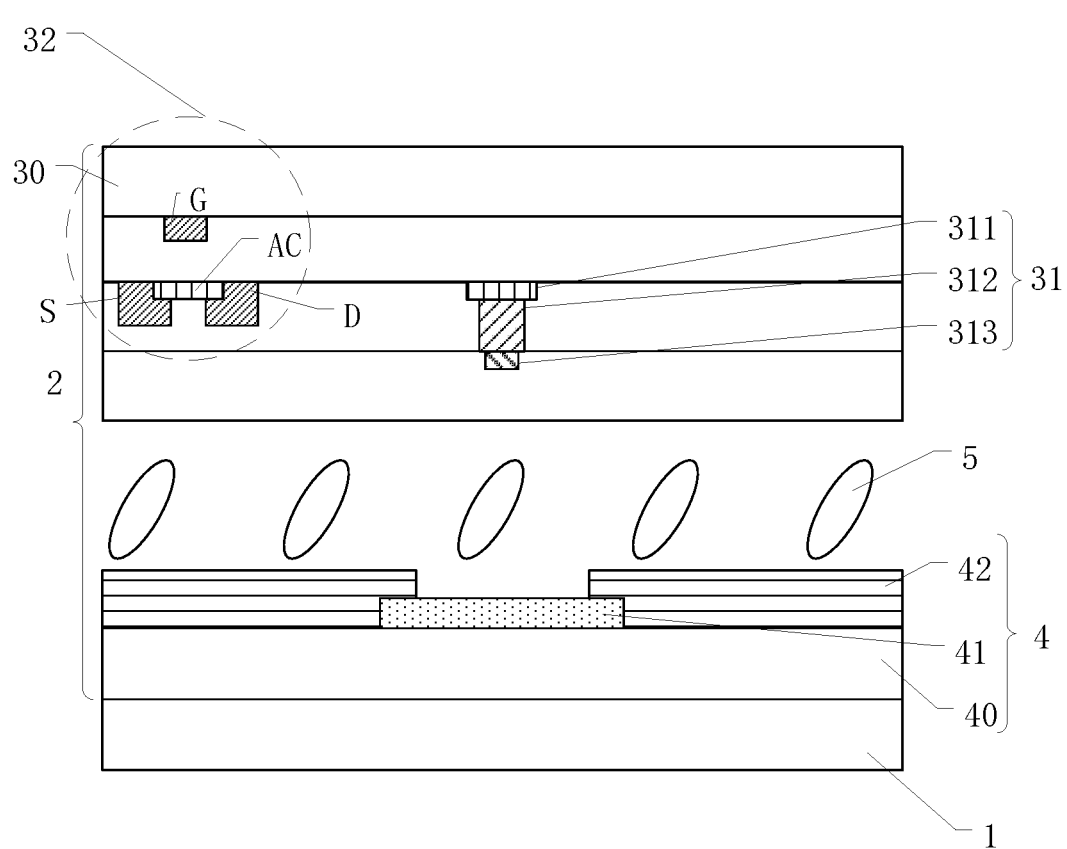
FIG. 4 illustrates another OO'-sectional view of the display apparatus in FIG. 2 consistent with various disclosed embodiments.

FIG. 4 illustrates another OO'-sectional view of the display apparatus in FIG. 2 consistent with various disclosed embodiments. As shown in FIG. 4, the array substrate 3 may include a substrate 30 and a plurality of thin film transistors 32. The plurality of thin film transistors 32 may be disposed on a side of the substrate 30 adjacent to the color film substrate 4. Each of the plurality of thin film transistors 32 may include a gate G, a source S, a drain D and an active layer AC. The fingerprint identification components 31 may be photodiodes. A photodiode may include a first semiconductor portion 311, a second semiconductor portion 312, and an electrode portion 313. The first semiconductor portion 311 may be disposed in the same layer as the active layer AC. The second semiconductor portion 312 may be disposed on a side of the first semiconductor portion 311 far away from the substrate 30. The electrode portion 313 may be disposed on a side of the second semiconductor portion 312 far away from the first semiconductor portion 311.

In particular, as shown in FIG. 4, in the disclosed display apparatus, the fingerprint identification components 31 may be photosensitive diodes, which may also be called photodiodes. A photodiode may be a photo-detector capable of converting light into a current or voltage signal. The photodiode often utilizes a PN junction structure with photosensitive characteristics, which is very sensitive to changes of light, and has unidirectional conductivity. Further, the photodiode may change its electrical characteristics when the light intensity is different. Therefore, the current in a circuit may be changed according to the intensity change of the light. For illustrative purposes, in the present disclosure, the fingerprint identification components 31 are photodiodes. In some embodiments, other photo-sensors may also be used as the fingerprint identification components.

For illustrative purposes, the present embodiment only exemplifies the thin film transistors 32 with a bottom gate structure as shown in FIG. 4 (e.g. the side of the gate G is located on the side of the active layer AC adjacent to the substrate 30). A thin film transistor having a top gate structure (e.g. the gate G is located on the side of the active layer AC far away from the substrate 30) may also be used. The structures of the thin film transistors are not specifically limited in the present disclosure.

In the display apparatus provided in the present disclosure, the fingerprint identification components may be photodiodes. The first semiconductor portion of the photodiode may be disposed in the same layer as the active layer. The second semiconductor portion may be disposed on a side of the first semiconductor portion far away from the substrate. The electrode portion may be disposed on a side of the second semiconductor portion far away from the first semiconductor portion. In particular, the film layer where the fingerprint identification components are located may be an existing film layer in the display panel, and the setting of the fingerprint identification components may not require an additional film layer. Thus, the thickness of the display apparatus may be reduced; and the quality of the display apparatus may be enhanced.

Figure 5:
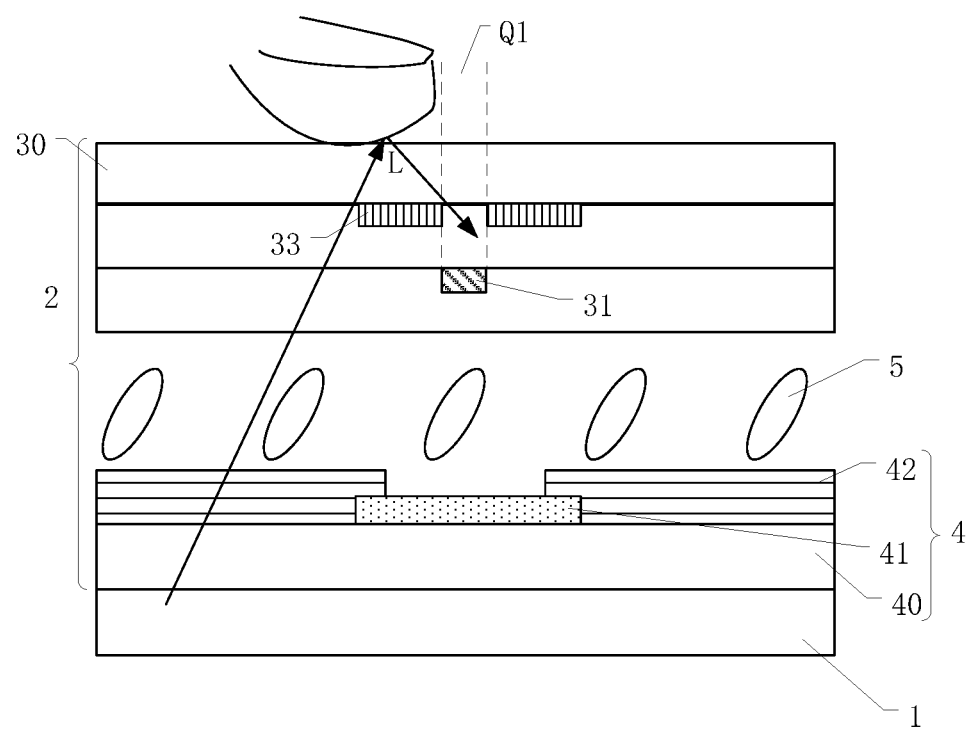
FIG. 5 illustrates another OO'-sectional view of the display apparatus in FIG. 2 consistent with various disclosed embodiments.

FIG. 5 illustrates another OO'-sectional view of the display apparatus in FIG. 2 consistent with various disclosed embodiments. As shown in FIG. 5, the array substrate 3 may include a light shielding layer 33 on the side of the fingerprint identification elements 31 adjacent to the substrate 30. The light shielding layer 33 may include a plurality of first hollowed-out portions Q1. The orthographic projection of the fingerprint identification elements 31 on the substrate 30 may coincide with the orthographic projection of the first hollowed-out portions Q1 on the substrate 30.

To clearly illustrate the beneficial effects of the present disclosure, a problem that may exist in the fingerprint identification in the prior design is described herein. When the fingerprint identification is performed by a means of photoelectric conversion, the light reflected from different positions of the finger may be irradiated to a same fingerprint identification unit. For example, the light emitted through the ridges of the fingers and the adjacent valleys may be irradiated to the same fingerprint identification unit such that the fingerprint identification unit that receives the light may be unable to detect the exact positions of the ridges and valleys of the fingerprint; and the fingerprint identification process may have a serious crosstalk phenomenon. Accordingly, the accuracy and precision for the fingerprint identification unit to identify the fingerprint may be adversely affected.

To reduce or avoid the occurrence of such a crosstalk situation, the display apparatus provided in the present disclosure provides the plurality of first hollowed-out portions Q1 on the light shielding layer 33. In particular, as shown in FIG. 5, in the display apparatus provided by the present disclosure, the region where the light shielding layer 33 coincides with the fingerprint identification components 31 may include the first hollowed-out portions Q1. When the light L of the backlight module 1 is emitted from the display panel and reflected back to the fingerprint identification components 31 through the finger, a portion of the crosstalk light of other adjacent valleys or ridges may be filtered out, and the crosstalk caused by other unrelated light to the reflection of the light L may be reduced. It may be equivalent to that the light L entering the fingerprint identification components 31 through the first hollowed-out portions Q1 may have undergone a collimating calibration. In one embodiment, along the direction perpendicular to the display apparatus, the regions of the light shielding layer 33 other than the first hollowed-out portions Q1 may coincide with the black matrix 41 to avoid affecting the light transmittance of the display apparatus.

In the display apparatus provided by the present disclosure, the plurality of first hollowed-out portions may be disposed on the light shielding layer of the display apparatus, and the first hollowed-out portions may coincide with the fingerprint identification components along the direction perpendicular to the display apparatus. Thus, when the light is reflected to the fingerprint identification components, the light shielding layer may be able to filter out a portion of the crosstalk light; and the accuracy of the fingerprint identification components to receive the light may be enhanced. Accordingly, the accuracy for the fingerprint identification components to identify the fingerprint may be improved; and the fingerprint identification capability of the display apparatus may be enhanced.

Figure 6:
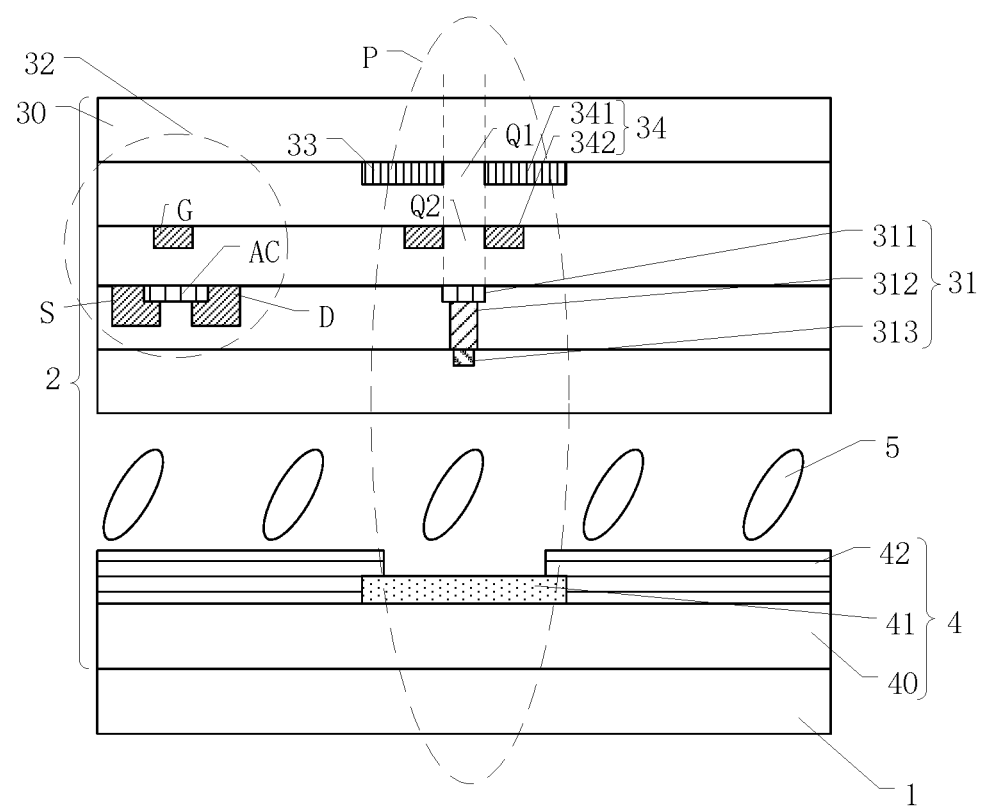
FIG. 6 illustrates another OO'-sectional view of the display apparatus in FIG. 2 consistent with various disclosed embodiments.
Figure 7:
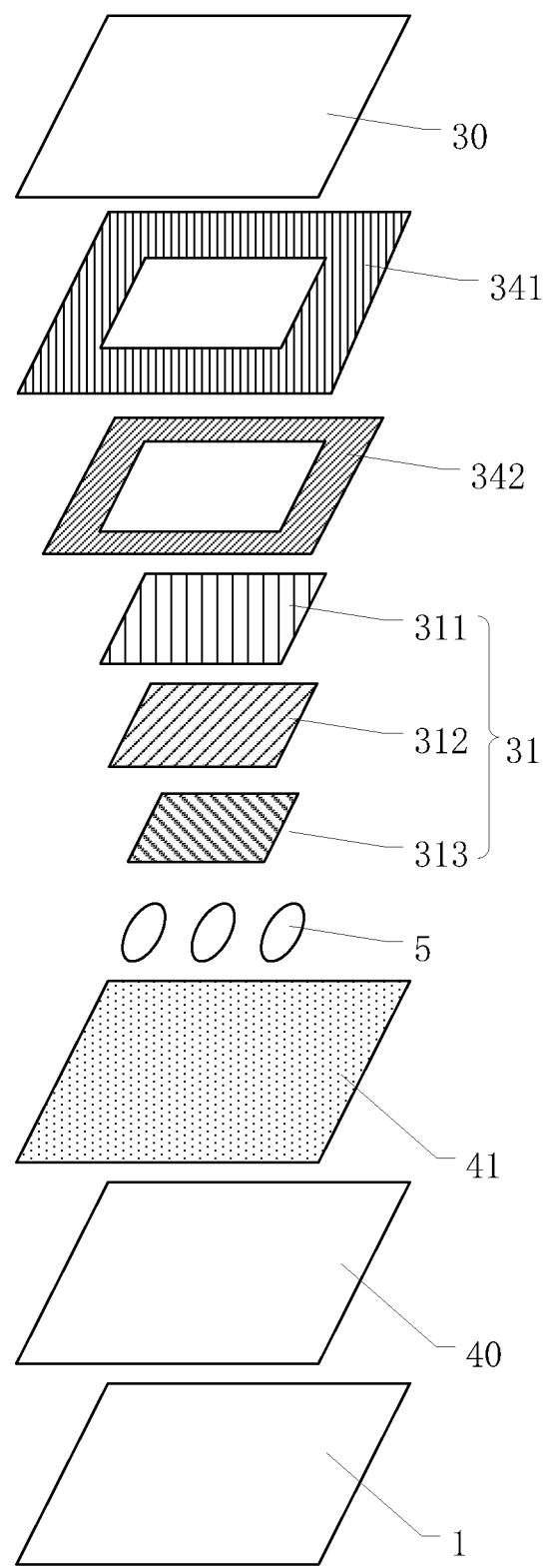
FIG. 7 illustrates a three-dimensional segmentation view of the region P in FIG. 6 consistent with various disclosed embodiments.
Figure 8:
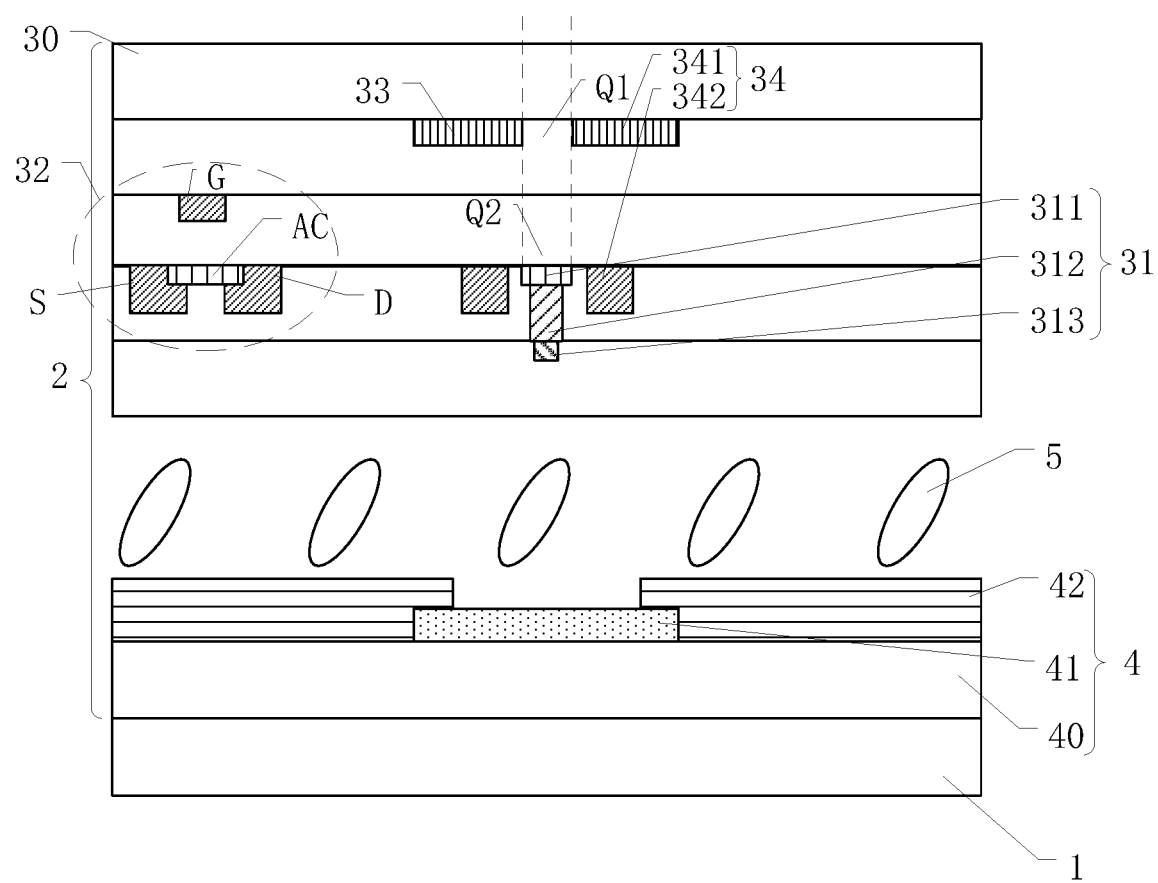
FIG. 8 illustrates another OO'-sectional view of the display apparatus in FIG. 2 consistent with various disclosed embodiments.

FIG. 6 illustrates another OO'-sectional view of the display apparatus in FIG. 2 consistent with various disclosed embodiments. FIG. 7 illustrates a three-dimensional segmentation view of the region P in FIG. 6 consistent with various disclosed embodiments. FIG. 8 illustrates another OO'-sectional view of the display apparatus in FIG. 2 consistent with various disclosed embodiments.

As shown in FIGS. 6-7, the array substrate 3 may include an optical path collimating system 34. The optical path collimating system 34 may include a first collimating layer 341 and a second collimating layer 342. The light shielding layer 33 may be multiplexed as the first collimating layer 341. The second collimating layer 342 may be disposed in the same layer as the gate G. The orthographic projection of the second collimating layer 342 on the substrate 30 may be located within the orthographic projection of the black matrix 41 on the substrate 30. The second collimating layer 342 may include a plurality of second hollowed-out portions Q2. The orthographic projection of the second hollowed-out portions Q2 on the substrate 30 may coincide with the orthographic projection of the first hollowed-out portions Q1 on the substrate 30. In some embodiments, as shown in FIG. 8, the second collimating layer 342 may also be disposed in the same layer as the source S.

In particular, as shown in FIG. 6-7, in the display apparatus provided by the present disclosure, the optical path collimating system 34 may include two layers, which are the first collimating layer 341 and the second collimating layer 342. The first collimating layer 341 may be multiplexed with the light shielding layer 33, and the second collimating layer 342 and the gate G may be disposed in the same layer. In one embodiment, the light shielding layer 33 may include the plurality of first hollowed-out portions Q1, along the direction perpendicular to the display apparatus, the light shielding layer 33 may not coincide with the fingerprint identification components 31. The second collimating layer 342 may only need to be disposed in the regions corresponding to the fingerprint identification components 31. The second collimating layer 342 and the fingerprint identification elements 31 may not coincide with each other along the direction perpendicular to the display apparatus.

In another embodiment, as shown in FIG. 8, the second collimating layer 342 may also be disposed in the same layer as the source S. The manner of setting other film layers may be referred to the manner in which the film layer is disposed in FIG. 6.

In one embodiment, the optical path collimating system 34 may include a first collimating layer 341, a second collimating layer 342, and a third collimating layer (not shown); and the light shielding layer 33 may be multiplexed with the first collimating layer 341. The second collimating layer 342 may be disposed in the same layer as the gate G, and the third collimating layer may be disposed in the same layer as the source S. The other film layer structures may be referred to the previous embodiments.

In the display apparatus provided in the present disclosure, the optical path collimating system may include a first collimating layer and a second collimating layer. The first collimating layer may multiplex with the light shielding layer, and the second collimating layer may multiplex the layer having the gate or the source. Thus, no additional layer may be needed; no additional manufacturing process may be required. A double-layer or multi-layer calibrated optical path collimating system may be formed by the existing film structure. Thus, it may not need to increase the thickness of the display apparatus; the production cost of the display apparatus may be reduced; the manufacturing process of the display apparatus may be simplified; and the manufacturing efficiency of the display apparatus may be improved. Further, the double-layer or multi-layer optical path collimating system may further calibrate the light reflected back to the fingerprint identification components to further filter out other adjacent crosstalk light from the valleys and ridges. Thus, the accuracy of the light receiving by the fingerprint identification components may be enhanced; and the accuracy for the fingerprint identification components to recognize the fingerprint may be improved. Accordingly, the fingerprint identification capability of the display apparatus may be improved.

Figure 9:
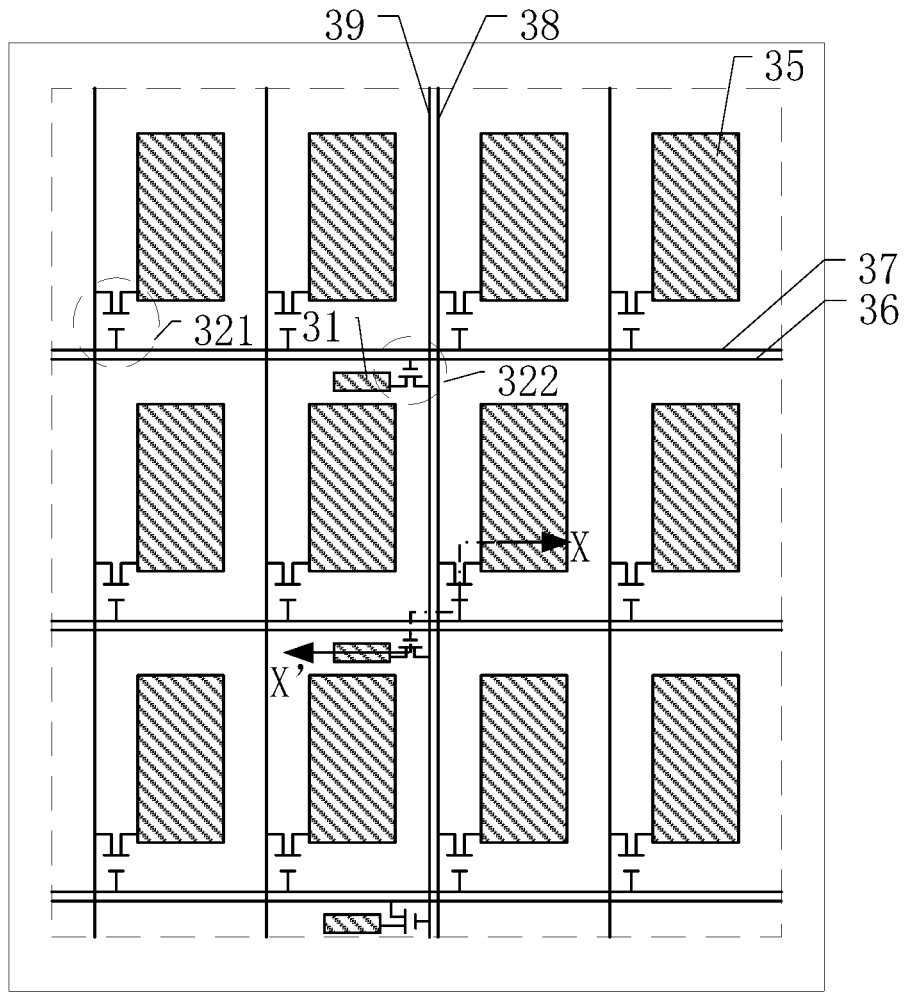
FIG. 9 illustrates an exemplary array substrate consistent with various disclosed embodiments.
Figure 10:
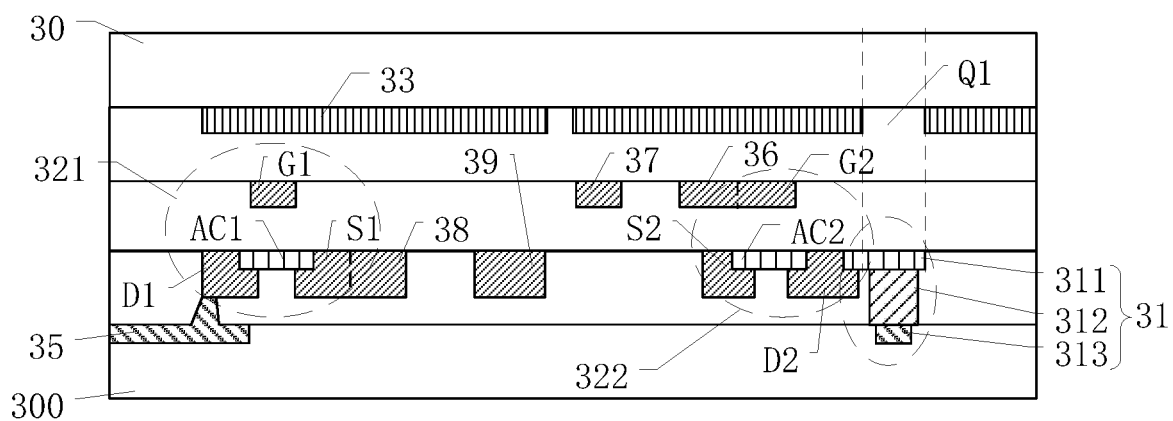
FIG. 10 illustrates an XX'-sectional view of the array substrate in FIG. 9 consistent with various disclosed embodiments.

FIG. 9 illustrates an exemplary array substrate consistent with various disclosed embodiments. FIG. 10 illustrates an XX'-sectional view of the array substrate in FIG. 9.

As shown in FIG. 9, the array substrate 3 may further include a plurality of pixel electrodes 35, a plurality of first gate lines 36, a plurality of second gate lines 37, a plurality of first data lines 38, and a plurality of second data lines 39. The thin film transistors 32 may include first thin film transistors 321 and second thin film transistors 322. The gate G1 of a first thin film transistor 321 may be electrically connected to a first gate line 36. The source S1 of the first thin film transistor 321 may be electrically connected to a first data line 38. The drain D1 of the first thin film transistor 321 may be electrically connected to a pixel electrode 35. The gate G2 of a second thin film transistor 322 may be electrically connected to a second gate line 37. The source S2 of the second thin film transistor 322 may be electrically connected to a second data line 39. The drain D2 of the second thin film transistor 322 may be electrically connected to a fingerprint identification component 31.

It should be understood that, in order to clearly illustrate the technical solution of the embodiment, FIGS. 9-10 only illustrate the structure of the array substrate 3, the color film substrate 4 and the backlight module 1, the color film substrate 4 and the backlight module 1 are not shown. Reference may be made to the arrangement of other embodiments of the present invention. It can be understood that a plurality of interlayer insulating layers (not shown) may also be further included for avoiding a short circuit between the gate G, the source S, the drain D, and the pixel electrode 35. In one embodiment, the surfaces of the pixel electrodes 35 may also be covered with an insulating layer to avoid a short circuit between the pixel electrode 35 and other adjacent electronic components.

In particular, as shown in FIGS. 9-10, the first thin film transistors 321 may be used to control the pixel electrodes 35, and the second thin film transistors 322 may be used to control the fingerprint identification elements 31. It should be noted that, in one embodiment, only the electrical connection relationship of the fingerprint identification components 31 is schematically illustrated by using FIG. 8 as an example, and the number of the fingerprint identification components 3, etc., is not specifically limited by the present disclosure.

In the display apparatus provided by the present disclosure, the first thin film transistors may be used to control the pixel electrodes and the second thin film transistors may be used to control the fingerprint identification components. The separated control approach may be able to improve the accuracy of the signal transmission and improve the performance of the display apparatus.

In one embodiment, as shown in FIGS. 9-10, the electrodes 313 of the fingerprint identification components 31 may be made of a metal material. The electrodes 313 may be disposed in the same layer as the pixel electrodes 35.

In particular, as shown in FIGS. 9-10, the fingerprint identification components 31 may be an opaque metal, and the light emitted from the backlight module 1 may be prevented from directly illuminating the fingerprint identification components 31. Thus, the interference to the fingerprint identification components 31 may be avoided.

In the display apparatus provided in the present disclosure, the opaque metal may used as the electrodes of the fingerprint identification components; and the metal electrodes may have a good conductivity. Further, the opaque metal may prevent the light emitted from the backlight module from directly irradiating on the fingerprint identification components. Thus, the interference to the fingerprint identification components may be avoided; and the fingerprint identification accuracy of the fingerprint identification components may be enhanced.

Figure 11:
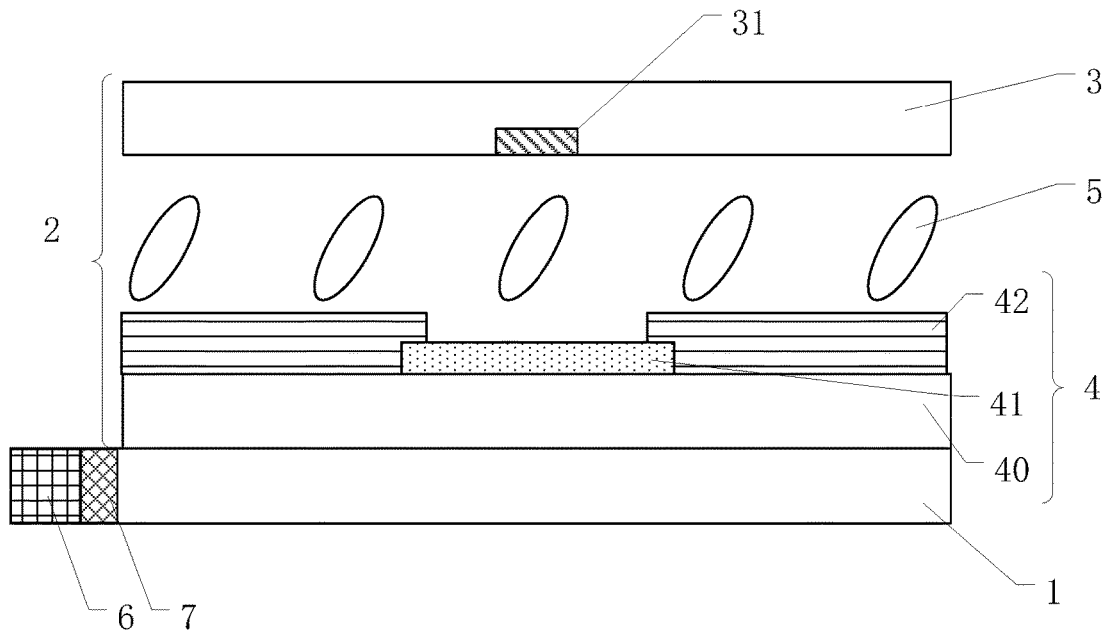
FIG. 11 illustrates another exemplary display apparatus consistent with various disclosed embodiments.

FIG. 11 illustrates another exemplary display apparatus consistent with various disclosed embodiments. As shown in FIG. 11, the backlight module 1 of the display apparatus may include a light stripe 7 and an infrared light module 6. The light stripe 7 may provide a light source for the display panel of the display apparatus. The fingerprint identification components of the display apparatus may perform the fingerprint identification using the infrared light emitted from the infrared light module 6.

In particular, as shown in FIG. 11, the infrared light module 6 may be included in the display apparatus as a light source for the fingerprint identification components 31. In the display apparatus, the fingerprint identification components 31 may perform the fingerprint identification using an infrared light. The adverse effect from the enteral environmental light and the internal light may be reduced. Further, the power consumption may be reduced and the precision of the fingerprint identification may be enhanced.

Figure 12:
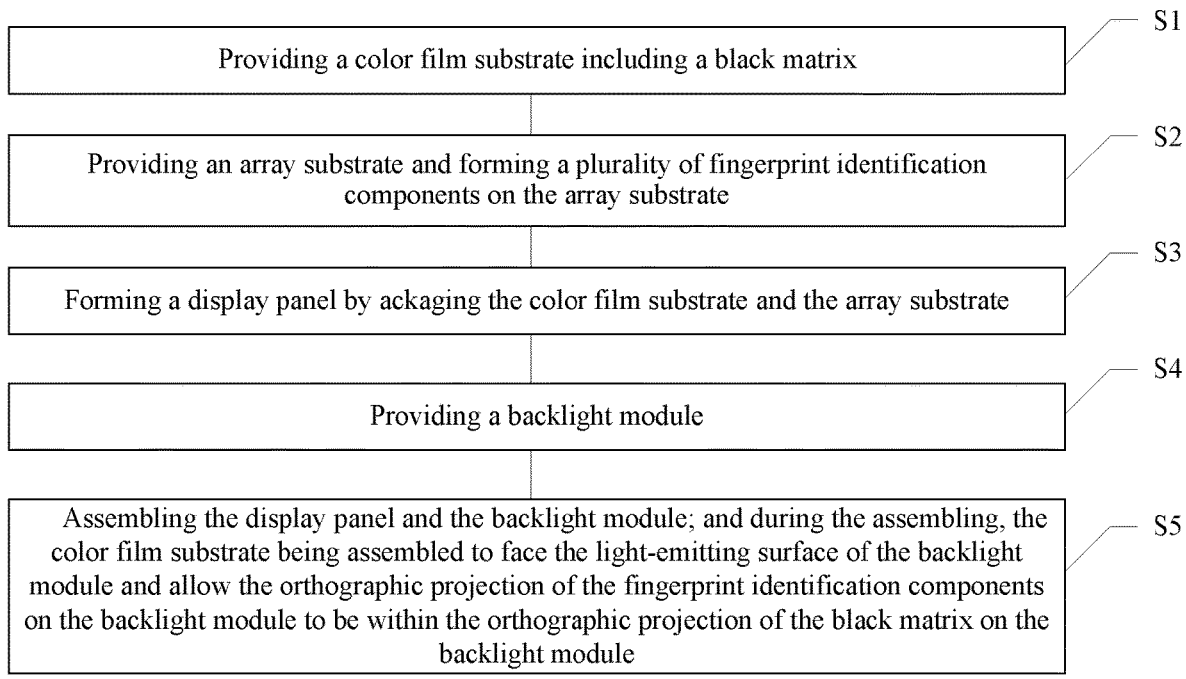
FIG. 12 illustrates a flow chart for fabricating an exemplary display apparatus consistent with various disclosed embodiments.

The present disclosure also provides a method for fabricating a display apparatus. FIG. 12 illustrates an exemplary fabrication process of a display apparatus consistent with various disclosed embodiments.

As shown in FIG. 12, an exemplary fabrication process of the display apparatus in FIG. 3 may include:

S1: providing a color film substrate 4 including a black matrix 41;
S2: providing an array substrate 3 and forming a plurality of fingerprint identification components on the array substrate;
S3: packaging the color film substrate 4 and the array substrate 3 to form a display panel 2;
S4: providing a backlight module 1; and
S5: assembling the display panel 2 and the backlight module 1.

During the process for assembling the display panel 2 and the backlight module 1, the color film substrate 4 may be assembled to face the light-emitting surface of the backlight module 1 and allow the orthographic projection of the fingerprint identification components on the backlight module 1 to be within the orthographic projection of the black matrix 41 on the backlight module 1.

In the disclosed method for fabricating the display apparatus, the color film substrate and the array substrate may be assembled inversely such that the light emitted from the backlight module may not need to pass through the layer structures including the liquid crystal layer, and the color filters etc. when being reflected to the fingerprint identification components. Accordingly, the number of the layers the light passing through may be reduced; and the loss of the light may be reduced. Further, in the disclosed method for fabricating the display apparatus, during the light-emitting process, the light may only need to pass through the liquid crystal layer and the color filter layer and it may not need to pass through the liquid crystal layer and the color filter layer during the reflection process. Thus, the interference of the liquid crystal layer and the color filter layer to the light may be reduced; and the precision of the fingerprint identification may be improved.

Figure 13:
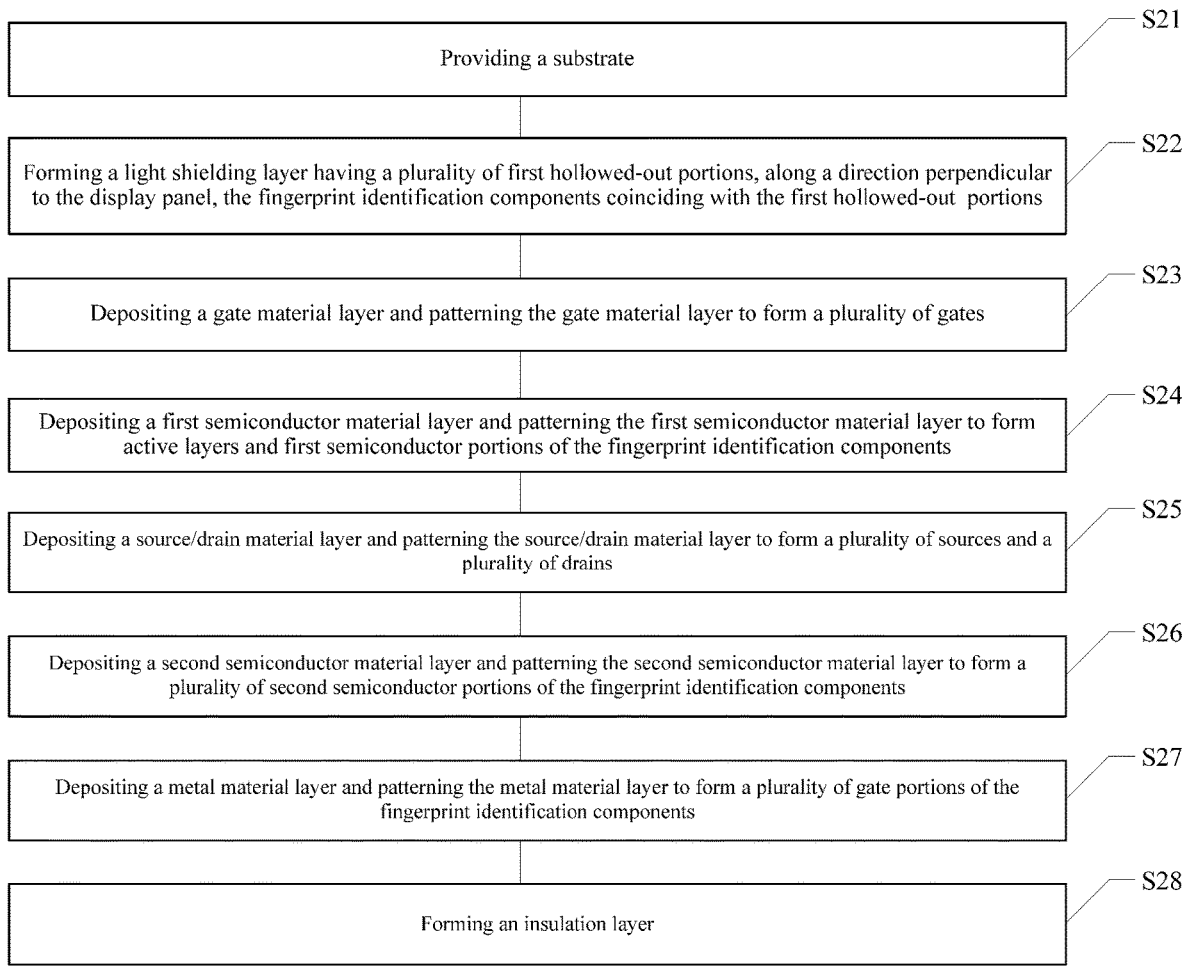
FIG. 13 illustrates a flow chart for fabricating an exemplary array substrate consistent with various disclosed embodiments.

FIG. 13 illustrates an exemplary process for fabricating an array substrate consistent with various disclosed embodiments. As show in FIG. 13 and referring to FIG. 10, an exemplary fabrication of an array substrate 10 may include:

S21: providing a substrate 30;
S22: forming a light shielding layer 33 having a plurality of first hollowed-out portions Q1, along a direction perpendicular to the display panel 2, the fingerprint identification components 31 coinciding with the first hollowed-out portions Q1;
S23: depositing a gate material layer and patterning the gate material layer to form a plurality of gates G;
S24: depositing a first semiconductor material layer and patterning the first semiconductor material layer to form a plurality of active layers AC and a plurality of first semiconductor portions 311 of the fingerprint identification components 31;
S25: depositing a source/drain material layer and patterning the source/drain material layer to form a plurality of sources S and a plurality of drains D;
S26: depositing a second semiconductor material layer and patterning the second semiconductor material layer to form a plurality of second semiconductor portions 312 of the fingerprint identification components 31;
S27: depositing a metal material layer and patterning the metal material layer to form a plurality of gate portions 313 of the fingerprint identification components 31; and
S28: forming an insulation layer 300.

After patterning the gate material layer to form the plurality gates G and before forming the first semiconductor material layer, an insulation layer may be formed to avoid a short circuit and/or connection between the gates G and the other layers. Similarly, after forming the sources S and the drains G, an insulation layer may also be formed.

In the disclosed method for fabricating a display apparatus, the fingerprint identification components may be photodiodes. The first semiconductor portions of the photodiodes and the active layers may be formed in a same layer; and the second semiconductor portions may be formed on a side of the first semiconductor portions away from the substrate. The gates of the photodiodes may be formed on a side of the second semiconductor portions away from the first semiconductor portions. In particular, the layer where the fingerprint identification components locate may be an existing layer in the display panel; and it may not need an extra layer for disposing the fingerprint identification components. Thus, the thickness of the display apparatus may be reduced; and the quality of the display apparatus may be improved.

Thus, the disclosed display apparatus and method for forming a display apparatus may achieve at least the following beneficial effects.

In the display apparatus provided by the present disclosure, the fingerprint identification components may be disposed on the array substrate; and the color film substrate and the array substrate may be inversely assembled. Thus, the light emitted from the backlight module may not need to pass through the layer structures including the liquid crystal layer, and color filters, etc. when being reflected back to the fingerprint identification components. Accordingly, the number of the layers the light passing through may be reduced; and the loss of the light may be reduced. Further, in the disclosed display apparatus, the light may only need to pass the liquid crystal layer and the color filter layer during the light emitting process but may not need to pass through the liquid crystal layer and the color filter layer during the reflection process. Thus, the interference of the liquid crystal layer and the color filter layer to the light may be reduced; and the precision of the fingerprint identification may be improved.

The description of the disclosed embodiments is provided to illustrate the present disclosure to those skilled in the art. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. A display apparatus, comprising:
a backlight module and a display panel opposite to the backlight module,
wherein:
the display panel includes an array substrate and a color film substrate opposite to the array substrate;
the array substrate is disposed on a side of the color film substrate away from the backlight module;
the color film substrate includes a black matrix;
the array substrate includes a plurality of fingerprint identification components; and
an orthographic projection of the plurality of fingerprint identification components on the backlight module is covered by an orthographic projection of the black matrix on the backlight module.

2. A display apparatus, comprising:
a backlight module and a display panel opposite to the backlight module,
wherein:
the display panel includes an array substrate and a color film substrate opposite to the array substrate;
the array substrate is disposed on a side of the color film substrate away from the backlight module;
the color film substrate includes a black matrix;
the array substrate includes a plurality of fingerprint identification components; and
an orthographic projection of the plurality of fingerprint identification components on the backlight module is within an orthographic projection of the black matrix on the backlight module, wherein:
the array substrate includes a substrate and a plurality of thin film transistors;
the plurality of thin film transistors are disposed on a side of the substrate adjacent to the color film substrate;
each of the plurality of thin film transistors includes a gate, a source, a drain and an active layer;
each of the plurality of fingerprint identification components is a photodiode;
the photodiode includes a first semiconductor portion, a second semiconductor portion and a gate portion;
the first semiconductor portion and the active layer are disposed in a same single layer;
the second semiconductor portion is disposed on a side of the first semiconductor portion away from the substrate; and
the gate portion is disposed on a side of the second semiconductor portion away from the first semiconductor portion.

3. The display apparatus according to claim 2, wherein:
the array substrate includes a light shielding layer;
the light shielding layer is disposed on a side of the plurality of the fingerprint identification components adjacent to the substrate;
the light shielding layer includes a plurality of first hollowed-out portions; and
an orthographic projection of the plurality of fingerprint identification components on the substrate coincides with an orthographic projection of the plurality of first hollowed-out portions on the substrate.

4. The display apparatus according to claim 3, wherein:
the array substrate includes an optical path collimating system;
the optical path collimating system includes a first collimating layer and a second collimating layer;
the light shielding layer is multiplexed as the first collimating layer;
the second collimating layer is disposed in a same single layer as one or more of the source and the drain of the thin film transistor;
an orthographic projection of the second collimating layer on the substrate is within an orthographic projection of the black matrix on the substrate;
the second collimating layer includes a plurality of second hollowed-out portions; and
an orthographic projection of the plurality of second hollowed-out portions on the substrate coincides with an orthographic projection of the plurality of first hollowed-out portions on the substrate.

5. The display apparatus according to claim 2, wherein:
the array substrate further includes a plurality of pixel electrodes, a plurality of first gate lines, a plurality of second gate lines, a plurality of first data lines, and a plurality of second data lines;
the plurality of thin film transistors includes a plurality of first thin film transistors and a plurality of second thin film transistors;
a gate of a first thin film transistor is electrically connected to a first gate line;
a source of the first thin film transistor is electrically connected to a first data line;
a drain of the first thin film transistor is electrically connected to a pixel electrode;
a gate of a second thin film transistor is electrically connected to a second gate line;
a source of the second thin film transistor is electrically connected to a second data line; and
a drain of the second thin film transistor is electrically connected to a fingerprint identification component.

6. The display apparatus according to claim 5, wherein:
the gate portions of the plurality of fingerprint identification components are made of a metal material; and
the gate portions of the plurality of fingerprint identification components and the plurality of pixel electrodes are disposed in a same single layer.

7. The display apparatus according to claim 1, wherein:
the color film substrate includes a plurality of color filters; and
at least a portion of the plurality of color filters are white in color.

8. The display apparatus according to claim 1, wherein:
the backlight module includes a light stripe and an infrared light module;
the light stripe provides a light source to the display panel; and
the plurality of fingerprint identification components perform a fingerprint identification through an infrared light emitted from the infrared light module.

9. A method for fabricating a display apparatus, comprising:
providing a color film substrate having a black matrix;
providing an array substrate and forming a plurality of fingerprint identification components on the array substrate;
forming a display panel by packaging the color film substrate and the array substrate;
providing a backlight module; and
assembling the display panel and the backlight module,
wherein:
when assembling the display panel and the backlight module, the color film substrate is assembled to face a light-emitting surface of the backlight module and to allow an orthographic projection of the plurality of fingerprint identification components on the backlight module to be covered by an orthographic projection of the black matrix on the backlight module.

10. The method according to claim 9, wherein providing the array substrate comprises:
provide a substrate;
forming a light shield layer, the light shielding layer including a plurality of first hollowed-out portions, and along a direction perpendicular to the display panel, the plurality of fingerprint identification components coinciding with the plurality of first hollowed-out portions;
depositing a gate metal material layer and patterning the gate metal material layer to form a plurality of gates of thin film transistors;
depositing a first semiconductor material layer and patterning the first semiconductor material layer to form a plurality of active layers and a plurality of first semiconductor portions of the plurality of fingerprint identification components;
depositing a source/drain material layer and patterning the source/drain material layer to form a plurality of sources and a plurality of drains of the thin film transistors;
depositing a second semiconductor material layer and patterning the second semiconductor material layer to form a plurality of second semiconductor portions of the plurality of fingerprint identification components;
depositing a metal material layer and patterning the metal material layer to form a plurality gate portions of the plurality of fingerprint identification components; and
forming an insulation layer.

11. The display apparatus according to claim 1, further including:
a liquid crystal layer between the array substrate and the color film substrate.

12. The display apparatus according to claim 11, wherein:
the plurality of fingerprint identification components are on a side of the liquid crystal layer away from the color film substrate.

13. The method according to claim 9, further including:
providing a liquid crystal layer between the array substrate and the color film substrate.

14. The method according to claim 13, wherein:
the plurality of fingerprint identification components are on a side of the liquid crystal layer away from the color film substrate.

* * * * *